United States Patent
Franca-Neto

(10) Patent No.: US 10,163,504 B2
(45) Date of Patent: Dec. 25, 2018

(54) PLANAR VARIABLE RESISTANCE MEMORY

(71) Applicant: Western Digital Technologies, Inc., San Jose, CA (US)

(72) Inventor: Luiz M. Franca-Neto, Sunnyvale, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 2 days.

(21) Appl. No.: 15/667,000

(22) Filed: Aug. 2, 2017

(65) Prior Publication Data

US 2017/0330620 A1  Nov. 16, 2017

Related U.S. Application Data

(62) Division of application No. 14/882,147, filed on Oct. 13, 2015, now Pat. No. 9,728,255.

(51) Int. Cl.
  *G11C 13/00* (2006.01)
  *H01L 27/105* (2006.01)
  *H01L 45/00* (2006.01)

(52) U.S. Cl.
  CPC ...... *G11C 13/0069* (2013.01); *G11C 13/0002* (2013.01); *G11C 13/003* (2013.01);
  (Continued)

(58) Field of Classification Search
  None
  See application file for complete search history.

(56) References Cited

U.S. PATENT DOCUMENTS 7,993,962 B2  8/2011  Chen et al.
8,476,612 B2  7/2013  Peters
(Continued)

FOREIGN PATENT DOCUMENTS

WO  2009/102918 A1  8/2009

OTHER PUBLICATIONS

"3-D-ICML: A 3D bipolar ReRAM design with interleaved complementary memory layers"; Department of ECE, NYU, Design, Automation & Test in Europe Conference & Exhibition, 2011; 1 page. Retrieved from http://www.researchgate.net/publication/224235992_3D-ICML_A_3D_bipolar_ReRAM_design_with_interleaved_complementary_memory_layers.
(Continued)

*Primary Examiner* — Hoai V Ho
*Assistant Examiner* — Jay Radke
(74) *Attorney, Agent, or Firm* — Patterson & Sheridan, LLP; Steven Versteeg

(57) ABSTRACT

An example memory device includes a planar semiconductor substrate layer; a planar variable resistance layer disposed above the planar semiconductor substrate layer; a planar channel layer disposed above the planar variable resistance layer; and one or more gates positioned along a length of the memory device and above the planar channel layer, wherein each respective gate of the one or more gates is configured to direct at least a portion of a current flowing through a respective region of the planar channel layer positioned below the respective gate into a respective region of the variable resistance layer positioned below the respective gate in response to a voltage applied to the respective gate being greater than a threshold voltage.

8 Claims, 8 Drawing Sheets

(52) U.S. Cl.
CPC ........ *G11C 13/004* (2013.01); *G11C 13/0004*
(2013.01); *H01L 27/1052* (2013.01); *H01L*
*45/06* (2013.01); *H01L 45/1233* (2013.01);
*H01L 45/1246* (2013.01); *G11C 2013/0045*
(2013.01); *G11C 2013/0078* (2013.01); *G11C*
*2213/53* (2013.01); *G11C 2213/75* (2013.01)

(56) References Cited

U.S. PATENT DOCUMENTS

| | | |
|---|---|---|
| 8,558,213 B2 | 10/2013 | Goux |
| 8,659,929 B2 | 2/2014 | Kumar |
| 8,687,432 B2 | 4/2014 | Hou et al. |
| 2013/0264533 A1 | 10/2013 | Hong et al. |
| 2013/0328005 A1* | 12/2013 | Shin .................. H01L 27/2436 257/1 |
| 2014/0071746 A1 | 3/2014 | Jurasek et al. |
| 2014/0185358 A1 | 7/2014 | Jo et al. |
| 2014/0301128 A1 | 10/2014 | Park |

OTHER PUBLICATIONS

Wong, et al.; "Phase Change Memory"; Department of Electrical Engineering, Stanford University; Jan. 6, 2015; 28 pages. Retrieved from http://www.itrs.net/ITWG/Beyond_CMOS/2010Memory_April/WhitePapers/Nanothermal%20Nanowire%20PCRAM.pdf.

* cited by examiner

PLANAR VARIABLE RESISTANCE MEMORY

CROSS-REFERENCE TO RELATED APPLICATIONS

This application is a divisional application of co-pending U.S. patent application Ser. No. 14/882,147, filed on Oct. 13, 2015, which herein is incorporated by reference.

TECHNICAL FIELD

This disclosure relates to variable resistance memory, and more particularly, to the design and use of planar variable resistance memory cells.

BACKGROUND

Memory devices used in computers or other electronics devices may be non-volatile memory or volatile memory. The main difference between non-volatile memory and volatile memory is that non-volatile memory may continue to store data without requiring a persistent power supply. As a result, non-volatile memory devices have developed into a popular type of memory for a wide range of electronic applications. For instance, non-volatile memory devices, including flash memory devices, are commonly incorporated into solid-state storage devices, such as solid-state drives (SSDs).

SUMMARY

In one example, a memory device includes a planar semiconductor substrate layer; a planar variable resistance layer disposed above the planar semiconductor substrate layer; a planar channel layer disposed above the planar variable resistance layer; and one or more gates positioned along a length of the memory device and above the planar channel layer, wherein each respective gate of the one or more gates is configured to direct at least a portion of a current flowing through a respective region of the planar channel layer positioned below the respective gate into a respective region of the variable resistance layer positioned below the respective gate in response to a voltage applied to the respective gate being greater than a threshold voltage.

In another example, a method includes accessing a particular memory cell of one or more memory cells of a memory device that includes a planar semiconductor substrate layer, a planar variable resistance layer disposed above the planar semiconductor substrate layer, a planar channel layer disposed above the planar variable resistance layer, and one or more gates positioned along a length of the memory device and above the planar channel layer, wherein each memory cell of the one or more memory cells is defined by a respective gate of the one or more gates, a respective region of the planar channel layer positioned below the respective gate, and a respective region of the variable resistance layer positioned below the respective gate, wherein accessing the particular memory cell comprises: causing a current to flow through the planar channel layer; and applying a voltage to the respective gate of the particular memory cell that is greater than a threshold voltage such that the respective gate directs at least a portion of the current flowing through a respective region of the planar channel layer positioned below the respective gate into the respective region of the variable resistance layer positioned below the respective gate.

In another example a data storage system includes one or more memory devices and a controller configured to write data to and read data from the one or more memory devices. In this example, the one or more memory devices each include a planar semiconductor substrate layer; a planar variable resistance layer disposed above the planar semiconductor substrate layer; a planar channel layer disposed above the planar variable resistance layer; and one or more gates positioned along a length of the memory device and above the planar channel layer, wherein each respective gate of the one or more gates is configured to direct at least a portion of a current flowing through a respective region of the planar channel layer positioned below the respective gate into a respective region of the variable resistance layer positioned below the respective gate in response to a voltage applied to the respective gate being greater than a threshold voltage.

The details of one or more examples are set forth in the accompanying drawings and the description below. Other features, objects, and advantages will be apparent from the description and drawings, and from the claims.

DETAILED DESCRIPTION

Figure 1:
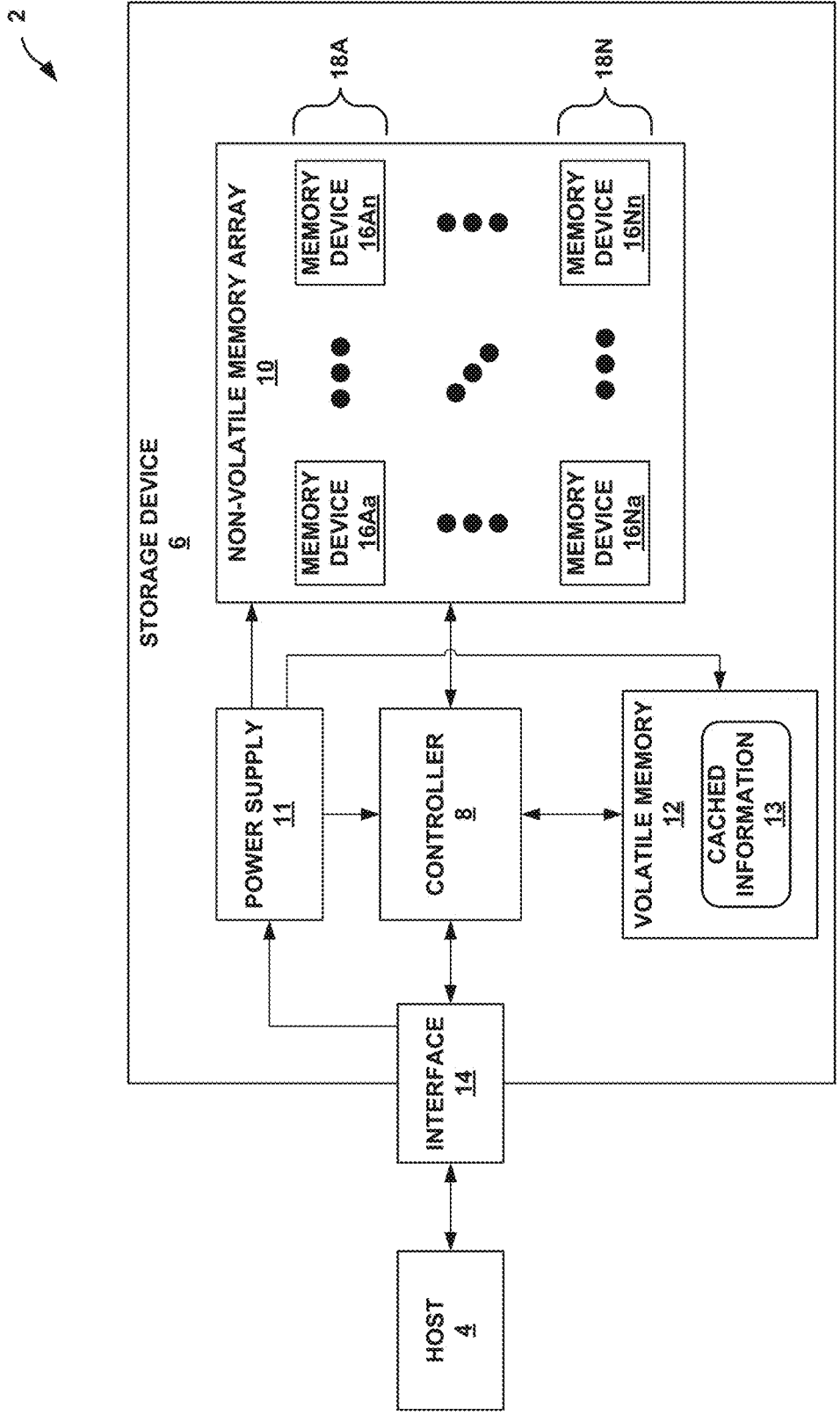
FIG. 1 is a conceptual and schematic block diagram illustrating an example storage environment in which a storage device may function as a storage device for a host device, in accordance with one or more techniques of this disclosure.

NAND Flash is the incumbent solid-state non-volatile memory used in SSDs. However, some alternative non-volatile memory technologies have been proposed which may present one or more advantages over NAND Flash. For instance, variable resistance memory technologies, such as Phase-Change Memory (PCM) and Resistive RAM (RRAM), may present one or more advantages over NAND Flash. One advantage that PCM and RRAM may have over NAND Flash is read latency (i.e., amount of time required to read data). Currently, the read latency of PCM and RRAM is approximately 75 ns-150 ns and the read latency of NAND Flash is approximately 100 μs. However, in addition to latency, an important characteristic of a memory device is the memory density, which is defined as the amount of data that may be stored within a unit area.

In operation, one or more access devices (i.e., selectors/transistors) may be used to access a PCM or RRAM memory cell. In some examples, a separate access device may be used to access each memory cell. Such a 1-selector/transistor-1-memory cell arrangement may be referred to as 1-T-1-M and may present one or more disadvantages. For instance, the size of the access device used with a memory cell may be dependent on the amount of current needed to read/program the memory cell. Given the relatively high current requirements to program PCM and RRAM memory cells (i.e., 350-450 micro-amps in 90 nm technologies) this 1-T-1-M arrangement may limit the memory density of PCM and RRAM memory cells. As such, it may be desirable to reduce the ratio of access devices to memory cells.

In some examples, a memory device may include memory cells that are capable of cell transparency. In this disclosure, a memory cell may be considered to be capable of cell transparency where, when the memory cell is not being accessed, an electrical property of the memory cell may be made independent of the data stored by the memory cell. For instance, a NAND Flash memory cell may be considered to be capable of cell transparency because the amount of current conducted by the floating-gate transistor of a NAND Flash memory cell may be made substantially independent of the charge stored in the floating-gate of the floating-gate transistor (i.e., the data stored by the memory cell) by applying a high enough voltage to the gate of the floating-gate transistor.

By being capable of cell transparency, a plurality of memory cells may be configured to be controlled by a single access device or a single pair of access devices. For instance, a plurality of NAND Flash memory cells can be connected in series to form a bit line and each bit line may be controlled by a single access device or a single pair of access devices. This capability may enable NAND Flash memory cells to be used in arrangements more advantageous than 1-T-1-M. However, as discussed above, variable resistance memory technologies may present one or more other advantages over NAND Flash. As such, it may be desirable for a memory device to incorporate the density advantages of NAND Flash with the other advantages of variable resistance memory.

In accordance with one or more techniques of this disclosure, a memory device may include a variable resistance memory cell configured such that the voltage across the variable resistance memory cell is selectively independent of the data stored by the variable resistance memory cell. For instance, a memory device may include a planar semiconductor substrate layer, a planar variable resistance layer disposed above the planar semiconductor substrate layer, a planar channel layer disposed above the planar variable resistance layer, and one or more gates positioned along a length of the memory device and above the planar channel layer. A planar memory cell may be defined by a respective gate of the one or more gates, a respective region of the planar channel layer positioned below the respective gate, and a respective region of the variable resistance layer positioned below the respective gate.

When the voltage applied to a gate of a particular planar memory cell is greater than a threshold voltage, the gate of the particular planar memory cell may direct at least a portion of a current flowing through a region of the planar channel layer of the particular planar memory cell into a region of the variable resistance layer of the particular planar memory cell. As such, when the voltage applied to the gate of the particular planar memory cell is greater than the threshold voltage, the voltage across the particular planar memory cell may be dependent on the resistance of the region of the variable resistance layer of the particular planar memory cell. However, when the voltage applied to the gate of the particular planar memory cell is not greater than the threshold voltage, the gate of the particular planar memory cell may not direct the portion of the current flowing through the region of the planar channel layer of the particular planar memory cell into the region of the variable resistance layer of the particular planar memory cell. As such, when the voltage applied to the gate of the particular planar memory cell is not greater than the threshold voltage, the voltage across the particular planar memory cell may not be dependent on the resistance of the region of the variable resistance layer of the particular planar memory cell. In this way, a variable resistance memory cell may be capable of cell transparency.

In some examples, the variable resistance memory cells may be organized into strings (i.e., bit lines) that are each controlled by a single access device or a single pair of access devices. In this way, the variable resistance memory cells may be used in arrangements more advantageous than 1-T-1-M.

FIG. 1 is a conceptual and schematic block diagram illustrating an example storage environment 2 in which storage device 6 may function as a storage device for host device 4, in accordance with one or more techniques of this disclosure. For instance, host device 4 may utilize non-volatile memory devices included in storage device 6 to store and retrieve data. In some examples, storage environment 2 may include a plurality of storage devices, such as storage device 6, that may operate as a storage array. For instance, storage environment 2 may include a plurality of storages devices 6 configured as a redundant array of inexpensive/independent disks (RAID) that collectively function as a mass storage device for host device 4.

Storage environment 2 may include host device 4 which may store and/or retrieve data to and/or from one or more storage devices, such as storage device 6. As illustrated in FIG. 1, host device 4 may communicate with storage device 6 via interface 14. Host device 4 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, and the like.

As illustrated in FIG. 1 storage device 6 may include controller 8, non-volatile memory array 10 (NVMA 10), power supply 11, volatile memory 12, and interface 14. In some examples, storage device 6 may include additional components not shown in FIG. 1 for sake of clarity. For example, storage device 6 may include a printed board (PB) to which components of storage device 6 are mechanically attached and which includes electrically conductive traces that electrically interconnect components of storage device 6; and the like. In some examples, the physical dimensions and connector configurations of storage device 6 may conform to one or more standard form factors. Some example standard form factors include, but are not limited to, 3.5" hard disk drive (HDD), 2.5" HDD, 1.8" HDD, peripheral component interconnect (PCI), PCI-extended (PCI-X), PCI Express (PCIe) (e.g., PCIe x1, x4, x8, x16, PCIe Mini Card, MiniPCI, etc.). In some examples, storage device 6 may be directly coupled (e.g., directly soldered) to a motherboard of host device 4.

Storage device 6 may include interface 14 for interfacing with host device 4. Interface 14 may include one or both of a data bus for exchanging data with host device 4 and a control bus for exchanging commands with host device 4. Interface 14 may operate in accordance with any suitable protocol. For example, interface 14 may operate in accordance with one or more of the following protocols: advanced technology attachment (ATA) (e.g., serial-ATA (SATA) and parallel-ATA (PATA)), Fibre Channel, small computer system interface (SCSI), serially attached SCSI (SAS), peripheral component interconnect (PCI), and PCI-express. The electrical connection of interface 14 (e.g., the data bus, the control bus, or both) is electrically connected to controller 8, providing electrical connection between host device 4 and controller 8, allowing data to be exchanged between host device 4 and controller 8. In some examples, the electrical connection of interface 14 may also permit storage device 6 to receive power from host device 4. For example, as illustrated in FIG. 1, power supply 11 may receive power from host device 4 via interface 14.

Storage device 6 may include NVMA 10, which may include a plurality of memory devices 16Aa-16Nn (collectively, "memory devices 16"). Each of memory devices 16 may be configured to store and/or retrieve data. For instance, a memory device of memory devices 16 may receive data and a message from controller 8 that instructs the memory device to store the data. Similarly, the memory device of memory devices 16 may receive a message from controller 8 that instructs the memory device to retrieve data. In some examples, each of memory devices 6 may be referred to as a die. In some examples, a single physical chip may include a plurality of dies (i.e., a plurality of memory devices 16). In some examples, each of memory devices 16 may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, memory devices 16 may include any type of non-volatile memory devices. Some examples, of memory devices 16 include, but are not limited to flash memory devices, phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices.

In some examples, one or more of memory devices 16 may be divided into a plurality of blocks which may divided into a plurality of pages. Further details of one example of a block of a memory device of memory devices 16 are discussed below with reference to FIG. 4.

In some examples, it may not be practical for controller 8 to be separately connected to each memory device of memory devices 16. As such, the connections between memory devices 16 and controller 8 may be multiplexed. As an example, memory devices 16 may be grouped into channels 18A-18N (collectively, "channels 18"). For instance, as illustrated in FIG. 1, memory devices 16Aa-16Nn may be grouped into first channel 18A, and memory devices 16Na-16Nn may be grouped into $N^{th}$ channel 18N.

The memory devices 16 grouped into each of channels 18 may share one or more connections to controller 8. For instance, the memory devices 16 grouped into first channel 18A may be attached to a common I/O bus and a common control bus. Storage device 6 may include a common I/O bus and a common control bus for each respective channel of channels 18. In some examples, each channel of channels 18 may include a set of chip enable (CE) lines which may be used to multiplex memory devices on each channel. For example, each CE line may be connected to a respective memory device of memory devices 18. In this way, the number of separate connections between controller 8 and memory devices 18 may be reduced. Additionally, as each channel has an independent set of connections to controller 8, the reduction in connections may not significantly affect the data throughput rate as controller 8 may simultaneously issue different commands to each channel.

In some examples, storage device 6 may include a number of memory devices 16 selected to provide a total capacity that is greater than the capacity accessible to host device 4. This is referred to as over-provisioning. For example, if storage device 6 is advertised to include 240 GB of user-accessible storage capacity, storage device 6 may include sufficient memory devices 16 to give a total storage capacity of 256 GB. The 16 GB of storage devices 16 may not be accessible to host device 4 or a user of host device 4. Instead, the additional storage devices 16 may provide additional blocks to facilitate writes, garbage collection, wear leveling, and the like. Further, the additional storage devices 16 may provide additional blocks that may be used if some blocks wear to become unusable and are retired from use. The presence of the additional blocks may allow retiring of the worn blocks without causing a change in the storage capacity available to host device 4. In some examples, the amount of over-provisioning may be defined as $p=(T-D)/D$, wherein p is the over-provisioning ratio, T is the total storage capacity of storage device 2, and D is the storage capacity of storage device 2 that is accessible to host device 4.

Storage device 6 may include power supply 11, which may provide power to one or more components of storage device 6. When operating in a standard mode, power supply 11 may provide power to the one or more components using power provided by an external device, such as host device 4. For instance, power supply 11 may provide power to the one or more components using power received from host device 4 via interface 14. In some examples, power supply 11 may include one or more power storage components configured to provide power to the one or more components when operating in a shutdown mode, such as where power ceases to be received from the external device. In this way, power supply 11 may function as an onboard backup power source. Some examples of the one or more power storage components include, but are not limited to, capacitors, super capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

Storage device 6 may include volatile memory 12, which may be used by controller 8 to store information. In some examples, controller 8 may use volatile memory 12 as a cache. For instance, controller 8 may store cached information 13 in volatile memory 12 until cached information 13 is written to memory devices 16. As illustrated in FIG. 1, volatile memory 12 may consume power received from power supply 11. Examples of volatile memory 12 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like).

Storage device 6 includes controller 8, which may manage one or more operations of storage device 6. For instance, controller 8 may manage the reading of data from and/or the writing of data to memory devices 16.

In accordance with one or more techniques of this disclosure, one or more of memory devices 16 may include one or more variable resistance memory cells capable of cell transparency. For instance, one or more of memory devices 16 may include one or more variable resistance memory cells configured such that the respective voltages across the variable resistance memory cells are selectively independent of the data stored by the respective variable resistance memory cells. Further details of one example of a variable resistance memory cell that may be included in a memory device of memory devices 16 are discussed below with reference to FIGS. 2A and 2B.

Figure 2A:
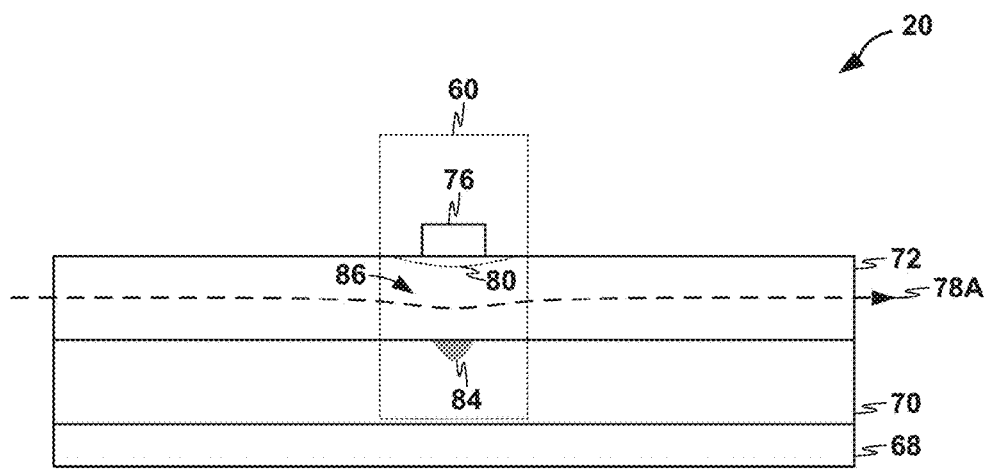
FIGS. 2A and 2B are conceptual diagrams illustrating example details of a memory device that includes a variable resistance memory cell capable of cell transparency, in accordance with one or more techniques of this disclosure.
Figure 2B:
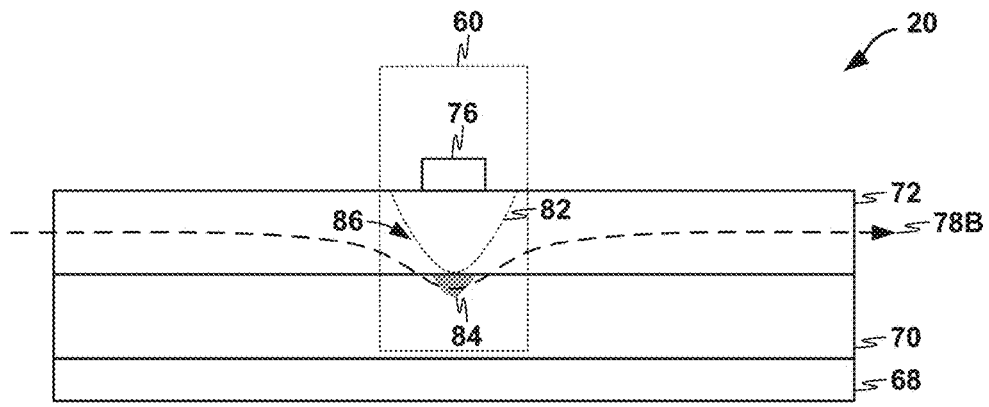

FIGS. 2A and 2B are conceptual diagrams illustrating example details of a memory device that includes a variable resistance memory cell capable of cell transparency, in accordance with one or more techniques of this disclosure. As illustrated in FIGS. 2A and 2B, memory device 20 may include semiconductor substrate layer 68, variable resistance layer 70, channel layer 72, and gate 76. In some examples, channel layer 72 may be disposed above (i.e., on-top of) variable resistance layer 70 that may be disposed above semiconductor substrate layer 68. In some examples, one or more of semiconductor substrate layer 68, variable resistance layer 70, and channel layer 72, may be planar. For instance, one or more of semiconductor substrate layer 68, variable resistance layer 70, and channel layer 72 may have an upper planar surface and a lower planar surface that are substantially parallel.

Memory device 20 may include semiconductor substrate layer 68, which may serve as a base layer for one or more other components of memory device 20. Semiconductor substrate layer 68 may be formed from any suitable material such as silicon, silicon dioxide, aluminum oxide, sapphire, germanium, gallium arsenide (GaAs), an alloy of silicon and germanium, or indium phosphide (InP).

Memory device 20 may include variable resistance layer 70, which may be configured to store data in the form of a plurality of resistance states. In some examples, variable resistance layer 70 may have a high-resistive state and a low-resistive state. In some examples, variable resistance layer 70 may have a high-resistive state, a low-resistive state, and one or more intermediate-resistive states. In some examples, regions of variable resistance layer 70 may be in different resistance states at the same time. For instance, at a particular time, a first region of variable resistance layer 70 may be in a high-resistive state and a second region of variable resistance layer 70 may be in a low-resistive state. In some examples, regions of variable resistance layer 70 may be configured to transition between resistance states in response to a current flowing through the regions. As one example, region 82 of variable resistance layer 70 may be configured to transition from the high-resistive state to the low-resistive state in response to a current flowing through region 82 being above a threshold current level for a first length of time. As another example, region 82 of variable resistance layer 70 may be configured to transition from the high-resistive state to the low-resistive state in response to a current flowing through region 82 being above a threshold current level for a second length of time. Examples of variable resistance layer 70 include, but are not limited to, PCM materials (e.g., chalcogenide glass) and RRAM materials (e.g., solid dielectrics).

Memory device 20 may include channel layer 72, which may be configured to be a path through which current may flow, and gate 76, which may be configured to create a depletion region within channel layer 72. The size of the depletion region created by gate 76 may be based on a level of a voltage applied to gate 76. For instance, when the level of the voltage applied to gate 76 is relatively low the size of the depletion region created by gate 76 may be smaller than the size of the depletion region created by gate 76 when the voltage applied to gate 76 is relatively high. As one example, when the voltage applied to gate 76 is less than a threshold, gate 76 may create depletion region 80. As another example, when the voltage applied to gate 76 is greater than the threshold, gate 76 may create depletion region 82. As shown in FIGS. 2A and 2B, depletion region 82 may be larger than depletion region 80.

Memory device 20 may include variable resistance memory cell 60, which may include gate 76, region 84 of variable resistance layer 70 positioned below gate 76, and region 86 of channel layer 72 positioned below gate 76. In accordance with one or more techniques of this disclosure, variable resistance memory cell 60 may be capable of cell transparency. For instance, the voltage across variable resistance memory cell 60 may be selectively made independent of the resistive state of (i.e., the data stored) variable resistance memory cell 60.

In operation, current may flow through memory device 20 along current path 78A. In some examples, to make the voltage across variable resistance memory cell 60 independent of the resistive state of region 84, the voltage applied to gate 76 may be selected such that the depletion region created by gate 76 is relatively small, such as in the example of FIG. 2A where gate 76 creates depletion region 80. When the depletion region created by gate 76 is relatively small the resistance of channel layer 72 may be less than the resistance of variable resistance layer 70. By not creating a large enough depletion region, gate 76 may cause the current to follow substantially along current path 78A, which does not pass through region 84. Where the current path does not pass through region 84, the resistive state of region 84 does not determine the voltage drop across variable resistance memory cell 60. In other words, when the depletion region created by gate 76 is relatively small, the voltage drop across variable resistance memory cell 60 will be approximately the same, regardless of whether region 84 is in a low-resistive state, a high-resistive state, or an intermediate-resistive state. In this way, the voltage across variable resistance memory cell 60 may be selectively made independent of the resistive state of variable resistance memory cell 60.

In some examples, to make the voltage across variable resistance memory cell 60 dependent on the resistive state of region 84, the voltage applied to gate 76 may be selected such that the depletion region created by gate 76 is relatively large, such as in the example of FIG. 2B where gate 76 creates depletion region 82. When the depletion region created by gate 76 is relatively large the resistance of channel layer 72 may be greater than the resistance of variable resistance layer 70. By creating a large enough depletion region, gate 76 may cause the current to follow current path 78B, which passes through region 84. Where the current path passes through region 84, the resistive state of region 84 may determine the voltage drop across variable resistance memory cell 60. In this way, the voltage across variable resistance memory cell 60 may be selectively made dependent on resistive state of variable resistance memory cell 60. Also in this way, a readout operation is possible for each cell. In order to write a cell, larger current pulse intensity and proper pulse duration may be utilized.

Figure 3A:
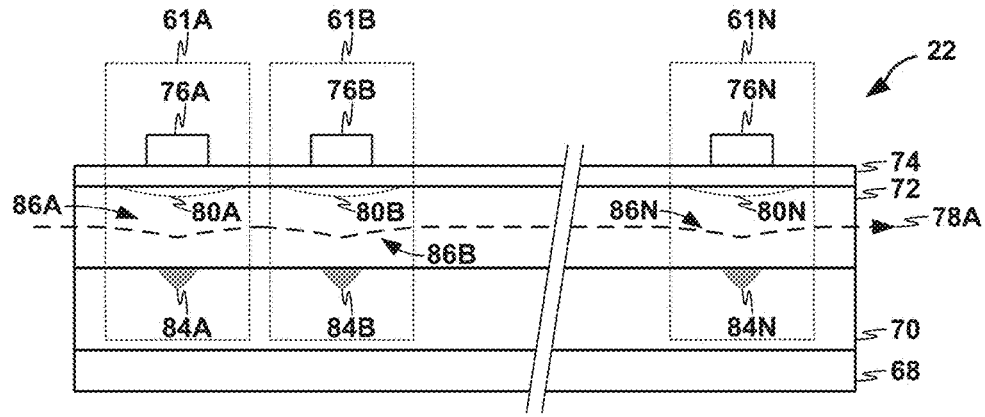
FIGS. 3A-3C are conceptual diagrams illustrating example details of a memory device that includes a plurality of variable resistance memory cells that are capable of cell transparency, in accordance with one or more techniques of this disclosure.
Figure 3B:
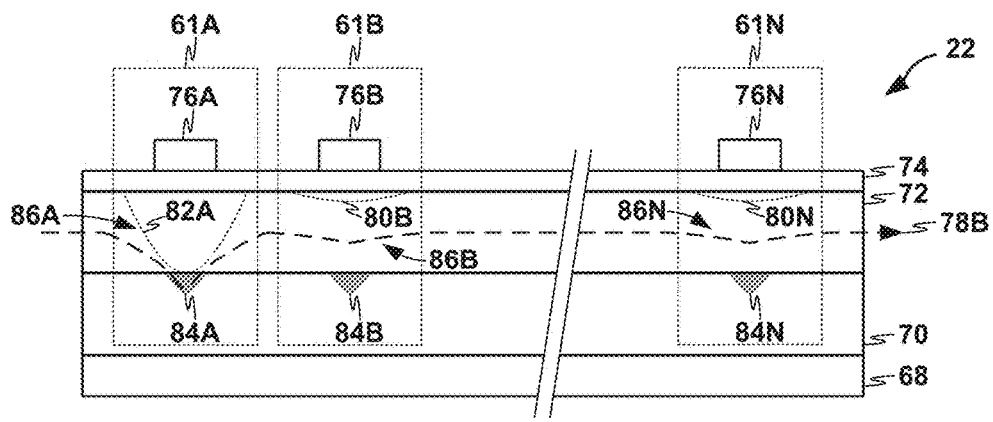
Figure 3C:
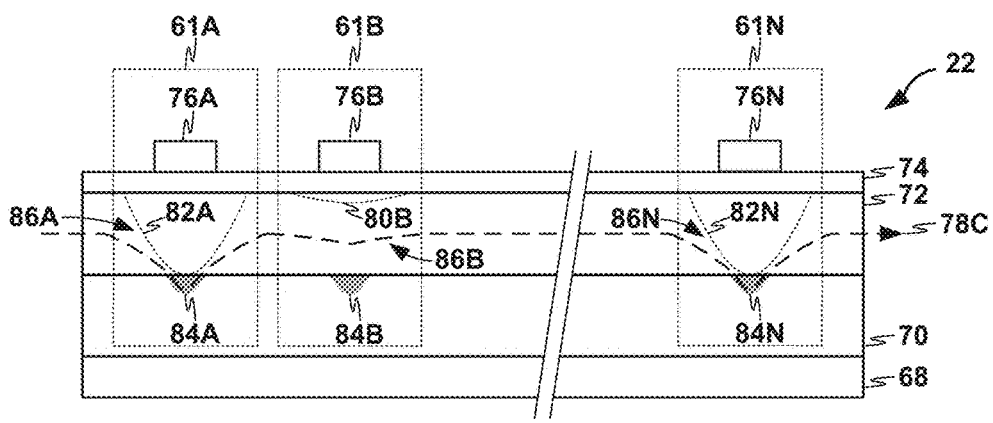

FIGS. 3A-3C are conceptual diagrams illustrating example details of a memory device that includes a plurality of variable resistance memory cells that are capable of cell transparency, in accordance with one or more techniques of this disclosure. In some examples, memory device 22 may include layers similar to memory device 20 of FIGS. 2A and 2B. For instance, as illustrated in FIGS. 3A-3C, memory device 22 may include semiconductor substrate layer 68, variable resistance layer 70, channel layer 72, and gates 76A-76N (collectively, "gates 76"). As also illustrated in FIGS. 3A-3C, memory device 22 may include oxide layer 74 disposed between channel layer 72 and gates 76. Similar to the layers of memory device 20, the layers of memory device 22 may, in some examples, be planar.

Memory device 22 may include oxide layer 74, which may be configured to reduce the amount of current flowing from gates 76 into channel layer 72. By including oxide layer 74, the current requirements of memory device 22 may be reduced.

Memory device 22 may include variable resistance memory cells 61A-61N (collectively, "variable resistance memory cells 61"). In some examples, each of variable resistance memory cells 61 may be an example of variable resistance memory cell 60 of FIGS. 2A and 2B. For instance, each of variable resistance memory cells 61 may include a respective gate of gates 76, a region of variable resistance layer 70 positioned below the respective gate of gates 76, and a region of channel layer 72 positioned below the respective gate of gates 76. As one example, variable resistance memory cell 61A may include gate 76A, region 84A of variable resistance layer 70 positioned below gate 76A, and region 86A of channel layer 72 positioned below gate 76A. In accordance with one or more techniques of this disclosure, each of variable resistance memory cells 61 may be capable of cell transparency. For instance, the voltage across each respective memory cell of variable resistance memory cells 61 may be selectively made independent of the resistive state of (i.e., the data stored) the respective variable resistance memory cell. In other words, as opposed to memory device 20 which is illustrated as including a single variable resistance memory cell memory device 22 may include a plurality of variable resistance memory cells that are each capable of cell transparency.

In operation, memory device 22 may cause a current to flow through channel layer 72. For instance, memory device may cause a current to flow through channel layer 72 along current path 78A. To access the data stored by a particular memory cell of variable resistance memory cells 61, the gate of the particular memory cell may direct at least a portion of the current flowing through a region of channel layer 72 positioned below the gate of the particular memory cell into a region of variable resistance layer 70 positioned below the gate of the particular memory cell. For instance, as illustrated in the example of FIG. 3B, to access the data stored by variable resistance memory cell 61A, gate 76A may direct at least a portion of the current flowing through region 86A of channel layer 72 into region 84A of variable resistance layer 70. In some examples, gate 76A may direct the portion of the current in response to being biased with a voltage that is greater than a threshold voltage. In any case, by creating a large enough depletion region, gate 76A may cause at least a portion of the current to follow current path 78B, which passes through region 84A.

With the current following current path 78B, variable resistance memory cell 61A may be accessed. In some examples, accessing variable resistance memory cell 61A may include reading data stored by variable resistance memory cell 61A. As variable resistance memory cell 61A stores data in the form of different resistive states, data may be read from variable resistance memory cell 61A by determining the resistive state of region 84A. Memory device 22 may determine the total voltage drop across variable resistance memory cells 61. As current path 78B passes through region 84A, the resistive state of region 84A may cause a voltage drop across variable resistance memory cells 61. However, as current path 78B does not pass through regions 84B-84N, the resistive states of regions 84B-84N may cause voltage drops across variable resistance memory cells 61. In this way, the data stored by variable resistance memory cell 61A may be read.

In some examples, accessing variable resistance memory cell 61A may include writing data to (i.e., programming) variable resistance memory cell 61A. To write data, memory device 22 may adjust one or both of the amount of current applied (i.e., that flows through channel layer 72) and the amount of time the current is applied. As current path 78B passes through region 84A, the current flowing through region 84A (directed from region 86A) may adjust the resistive state of region 84A. However, as current path 78B does not pass through regions 84B-84N, the current flowing along current path 78B may not adjust the resistive states of regions 84B-84N. In this way, data may be written to variable resistance memory cell 61A.

In some examples, it may be desirable to access a plurality of memory cells at the same time (i.e., in parallel). For instance, by accessing a plurality of memory cells at the same time the total time needed to read from or write to the plurality of memory cells may be reduced.

In operation, to access a plurality of memory cells at the same time, the plurality of memory cells being accessed may be made non-transparent while the memory cells not being accessed may be made transparent. As illustrated in the example of FIG. 3C, to contemporaneously access variable resistance memory cells 61A and 61N, gate 76A of variable resistance memory cell 61A may direct at least a portion of the current flowing through region 86A of channel layer 72 into region 84A of variable resistance layer 70 and gate 76N of variable resistance memory cell 61N may direct at least a portion of the current flowing through region 86N of channel layer 72 into region 84N of variable resistance layer 70. By creating large enough depletion regions, gate 76A and 76N may cause at least a portion of the current to follow current path 78C, which passes through regions 84A and 84N.

With the current following current path 78C, variable resistance memory cells 61A and 61N may be accessed. In some examples, accessing variable resistance memory cells 61A and 61N in parallel may include writing data to (i.e., programming) variable resistance memory cells 61A and 61N. To write data, memory device 22 may adjust one or both of the amount of current applied (i.e., that flows through channel layer 72) and the amount of time the current is applied. As current path 78C passes through regions 84A and 84N, the current flowing through regions 84A and 84N (respectively directed from regions 86A and 86N) may adjust the resistive states of regions 84A and 84N. However, as current path 78C does not pass through region 84B, the current flowing along current path 78C may not adjust the resistive state of region 84B. In this way, data may be written to variable resistance memory cells 61A and 61N at the same time.

Figure 4:
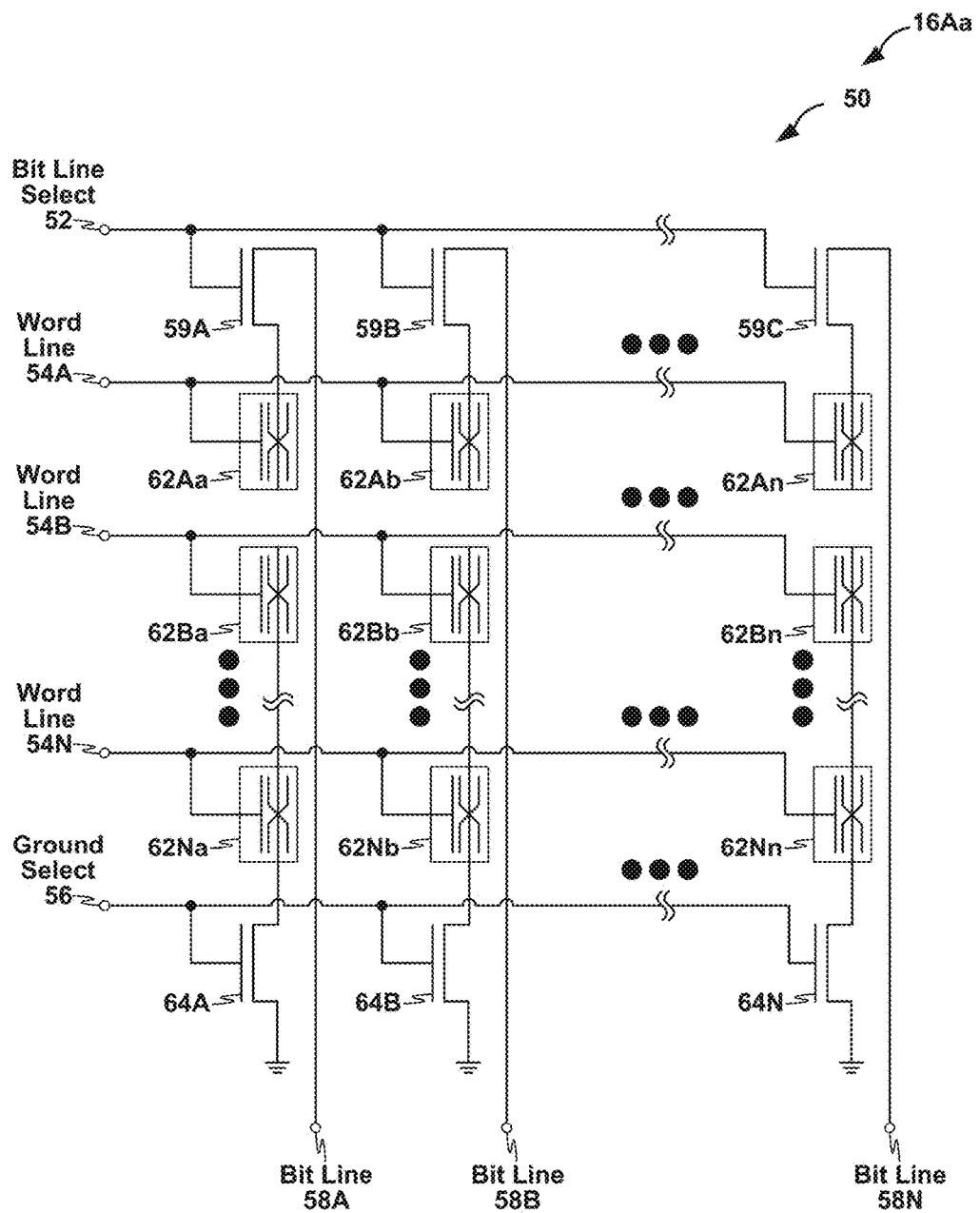
FIG. 4 is a conceptual and schematic block diagram illustrating example details of a two-dimensional array of variable resistance memory cells, in accordance with one or more techniques of this disclosure.

FIG. 4 is a conceptual and schematic block diagram illustrating example details of a two-dimensional array of variable resistance memory cells, in accordance with one or more techniques of this disclosure. For purposes of illustration, the two-dimensional array of variable resistance memory cells is described below as block 50 of memory device 16Aa. As illustrated in FIG. 4, block 50 of memory device 16Aa may include bit line select transistors 59A-59C (collectively, "bit line select transistors 59"), memory cells 62Aa-62Nn (collectively, "memory cells 62"), and ground select transistors 64A-64C (collectively, "ground select transistors 64").

In some examples, block 50 may include memory cells 62, which may each be configured to store one or more bits of data. In some examples, memory cells 62 may be non-volatile memory cells, such as PCM or RRAM memory cells. In some examples, memory cells 62 may be an example of variable resistance memory cells 61 of FIGS. 3A-3C.

As discussed above, the memory cells of a block may be arranged into rows and columns respectively referred to as word lines and bit lines. As illustrated in FIG. 4, memory cells 62 are arranged into and electrically connected in word lines 54A-54N (collectively, "word lines 54") and bit lines 58A-58N (collectively, "bit lines 58"). Memory cells 62Aa-62An may be considered to be on word line 54A because the gates of memory cells 62Aa-62An are commonly connected. Similarly, memory cells 62Ba-62Bn may be considered to be on word line 54B because the gates of memory cells 62Ba-62Bn are commonly connected. Memory cells 62Aa-62Na may be considered to be on bit line 58A because the sources and drains of memory cells 62Aa-62An are connected in series. Similarly, memory cells 62Ab-62Nb may be considered to be on bit line 58B because the sources and drains of memory cells 62Ab-62Ab are connected in series. In some examples, the memory cells of memory cells 62 on a bit line may be referred to as a memory cell string or string of memory cells.

In some examples, block 50 may include bit line select transistors 59, which may be configured to selectively couple memory cells to bit lines. As one example, bit line select transistor 59A may selectively couple memory cells 62Aa-62Na to bit line 58A in response to a signal being applied to bit line select 52. As another example, bit line select transistor 59B may selectively couple memory cells 62Ab-62Nb to bit line 58B in response to a signal being applied to bit line select 52. In some examples, bit line select transistors 59 may be volatile. Some examples of bit line select transistors 59 include, but are not limited to, bipolar junction transistors (BJTs), junction gate field-effect transistor (JFET), metal-oxide semiconductor field-effect transistor (MOSFET), or any other suitable transistor.

In some examples, block 50 may include ground select transistors 64, which may be configured to selectively couple memory cells to ground. As one example, ground select transistor 64A may selectively couple memory cells 62Aa-62Na to ground in response to a signal being applied to ground select 56. As another example, ground select transistor 64B may selectively couple memory cells 62Ab-62Nb to ground in response to a signal being applied to ground select 56. In some examples, ground select transistors 64 may be volatile. Some examples of ground select transistors 64 include, but are not limited to, bipolar junction transistors (BJTs), junction gate field-effect transistor (JFET), metal-oxide semiconductor field-effect transistor (MOSFET), or any other suitable transistor.

In some examples, memory device 16Aa may include one or more voltage sources. For instance, memory device 16Aa may include a plurality of voltage sources respectively coupled to bit lines 58. Additionally, in some examples, memory device 16Aa may include one or more decoders configured to measure resistances. For instance, memory device 16Aa may include one or more one or more decoders configured to determine respective resistances across memory cells of respective bit lines. As one example, a decoder may include a sense resistor electrically positioned between a voltage source and ground and an ammeters configured to measure the current flowing through the sense resistor. Based on the known resistance of the sense resistor and the voltage output by the voltage source, the decoder may determine the resistance of a bit line.

As discussed above and in accordance with one or more techniques of this disclosure, memory cells 62 may be variable resistance memory cells capable of cell transparency. In some examples, each memory cell of memory cells 62 may be a separate memory device. For instance, each memory cell of memory cells 62 may be similar to memory cell 60 of memory device 20. In some examples, a plurality of memory cells 62 may be disposed on a single memory device. As one example, the memory cells of memory cells 62 one a particular bit line may be disposed on a single memory device. For instance, memory cells 62Aa-62Na may be similar to memory cells 61 of memory device 22. As another example, all of memory cells 62 may be disposed on a single memory device. For instance, a memory device may include a planar substrate layer, a planar variable resistance layer disposed above the planar substrate layer, a planar channel layer disposed above the planar variable resistance layer, and a plurality of gates positioned in a grid above the planar channel layer.

Figure 5A:
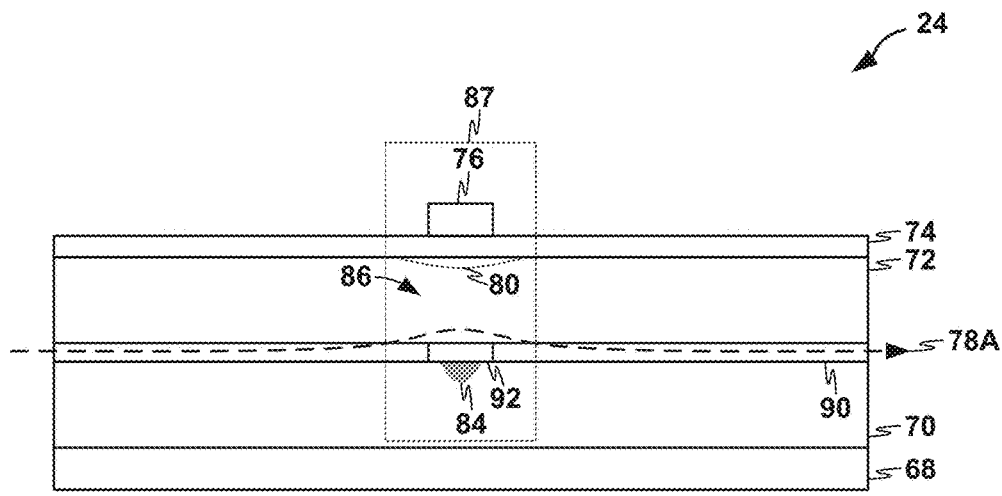
FIGS. 5A and 5B are conceptual diagrams illustrating example details of a memory device that includes a variable resistance memory cell capable of cell transparency, in accordance with one or more techniques of this disclosure.
Figure 5B:
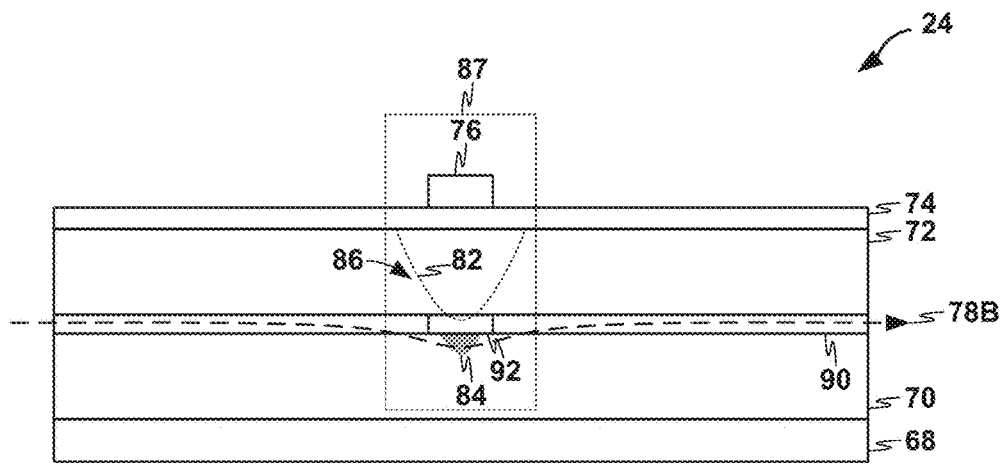

FIGS. 5A and 5B are conceptual diagrams illustrating example details of a memory device that includes a variable resistance memory cell capable of cell transparency, in accordance with one or more techniques of this disclosure. In some examples, memory device 24 may include layers similar to memory device 20 of FIGS. 2A and 2B. For instance, as illustrated in FIGS. 5A and 5B, memory device 24 may include semiconductor substrate layer 68, variable resistance layer 70, channel layer 72, and gate 76. As also illustrated in FIGS. 5A and 5B, memory device 24 may include oxide layer 74 disposed between channel layer 72 and gates 76. Similar to the layers of memory device 20, the layers of memory device 24 may, in some examples, be planar.

In some examples, memory device 24 may include conductive layer 90 disposed between channel layer 72 and variable resistance layer 70. Conductive layer 90 may be formed of any suitable conductive material, such as a metal.

In some examples, memory device 24 may include non-conductive plug 92 positioned within conductive layer 90. As illustrated in FIGS. 5A and 5B, plug 92 may be aligned with gate 76.

Memory device 24 may include variable resistance memory cell 87. In some examples, variable resistance memory cell 87 may be configured to perform operations similar to variable resistance memory cell 60 of FIGS. 2A and 2B. For instance, variable resistance memory cell 87 may be configured to operate in a transparent state in which gate 76 directs current through region 84 and a non-transparent state in which gate 76 does not direct current through region 84.

In operation, a voltage may be applied across memory device 24. In response to the voltage, current may flow through memory device 24. As current flows along the path of least resistance, the current may flow through conductive layer 90 until it reaches plug 92 at which point the current may either flow through region 86 or region 84. In accordance with one or more techniques of this disclosure, gate 76 may selectively cause the current to flow through region 86 or region 84. As shown in the example of FIG. 5A, where the depletion region created by gate 76 within channel layer 72 is relatively small (i.e., depletion region 80), the current may flow along current path 78A which passes through region 86. Similarly, as shown in the example of FIG. 5B, where the depletion region created by gate 76 within channel layer 72 is relatively large (i.e., depletion region 82), the current may flow along current path 78B which passes through region 84.

While illustrated as including a single memory cell, in some examples, memory device 24 may include a plurality of variable resistance memory cells 87 that are each configured to operate in a transparent state and a non-transparent state. In some of such examples, memory device 24 may include a respective plug 92 positioned below the gate of each of the plurality of variable resistance memory cells 87.

In some examples, the dimensions of plug 92 may be selected based on one or more electrical requirements. For instance, in some examples, the conductivity of channel layer 72 when in its more conductive state (smaller depletion region), $R_{on\_channel}$, may need to be much more conductive than the conductivity of variable resistance layer 70 in its lower resistive state, $R_{LRS}$. In some examples, the conductivity of channel layer 72 in its less conductive state (larger depletion region), $R_{on\_channel}$, may need to be less conductive than the conductivity of variable resistance layer 70 in its higher resistive state ($R_{HRS}$). As one example, a thickness of plug 92 may be made greater than a thickness of conductive layer 90. As another example, a thickness of plug 92 may be made less than a thickness of conductive layer 90.

Figure 6A:
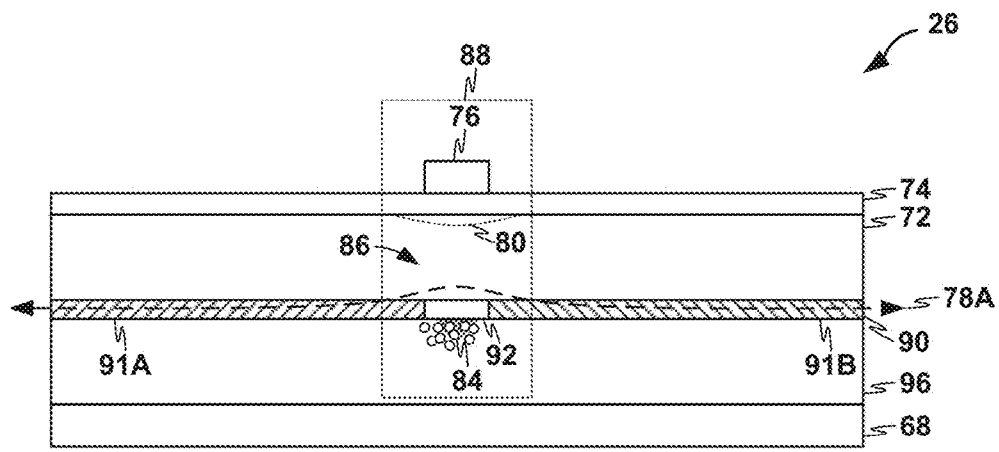
FIGS. 6A and 6B are conceptual diagrams illustrating example details of a memory device that includes a variable resistance memory cell capable of cell transparency, in accordance with one or more techniques of this disclosure.
Figure 6B:
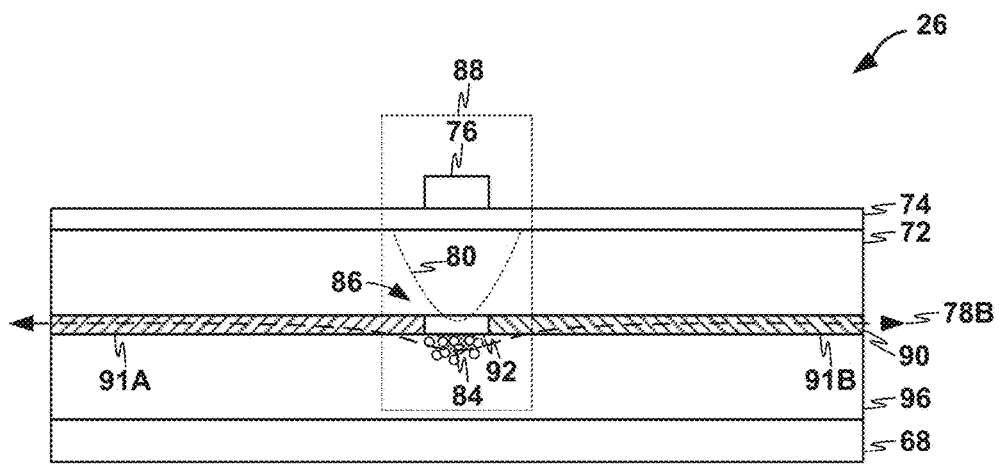

FIGS. 6A and 6B are conceptual diagrams illustrating example details of a memory device that includes a variable resistance memory cell capable of cell transparency, in accordance with one or more techniques of this disclosure. In some examples, memory device 26 may include layers similar to memory device 24 of FIGS. 5A and 5B. For instance, as illustrated in FIGS. 6A and 6B, memory device 26 may include semiconductor substrate layer 68, variable resistance layer 70, channel layer 72, and gate 76. As also illustrated in FIGS. 6A and 6B, memory device 26 may include oxide layer 74 disposed between channel layer 72 and gate 76. Similar to the layers of memory device 24, the layers of memory device 26 may, in some examples, be planar.

In some examples, memory device 26 may include conductive layer 90 disposed between channel layer 72 and variable resistance layer 70. However, as opposed to conductive layer 90 of FIGS. 5A and 5B which is formed of a single material, conductive layer 90 of memory device 26 may be formed a plurality of different materials. As illustrated in FIGS. 6A and 6B, conductive layer 90 may include first conductive material 91A and second conductive material 91B alternately disposed between plug 92. When variable resistance layer 70 includes RRAM, one of the conductive materials may be the source of the metal atoms or oxygen vacancies that modulate the cell conductivity. In one example, first conductive material 91A may be copper and second conductive material 91B may be silver.

In some examples, memory device 26 may include non-conductive plug 92 positioned within conductive layer 90. As illustrated in FIGS. 6A and 6B, plug 92 may be aligned with gate 76. As discussed above, one or more dimensions of plug 92 may be selected based on one or more electrical requirements.

Memory device 26 may include variable resistance memory cell 88. In some examples, variable resistance memory cell 88 may be configured to perform operations similar to variable resistance memory cell 60 of FIGS. 2A and 2B. For instance, variable resistance memory cell 88 may be configured to operate in a transparent state in which gate 76 directs current through region 84 and a non-transparent state in which gate 76 does not direct current through region 84.

Figure 7A:
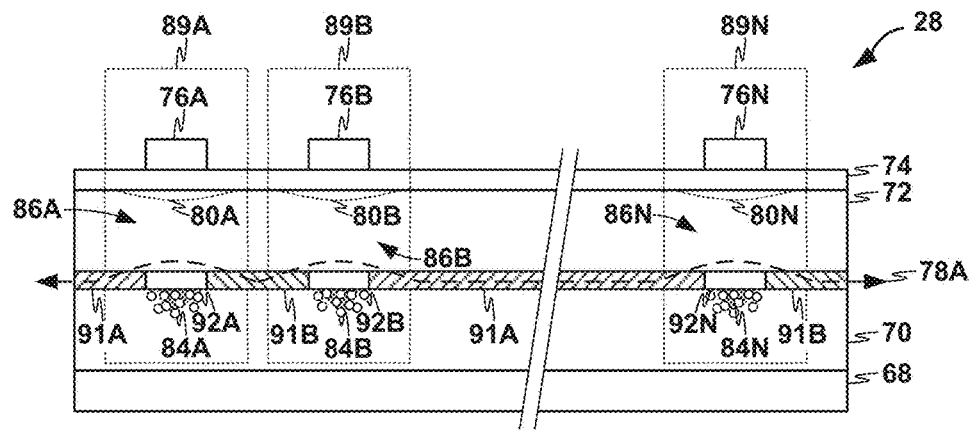
FIGS. 7A and 7B are conceptual diagrams illustrating example details of a memory device that includes a plurality of variable resistance memory cells that are capable of cell transparency, in accordance with one or more techniques of this disclosure.
Figure 7B:
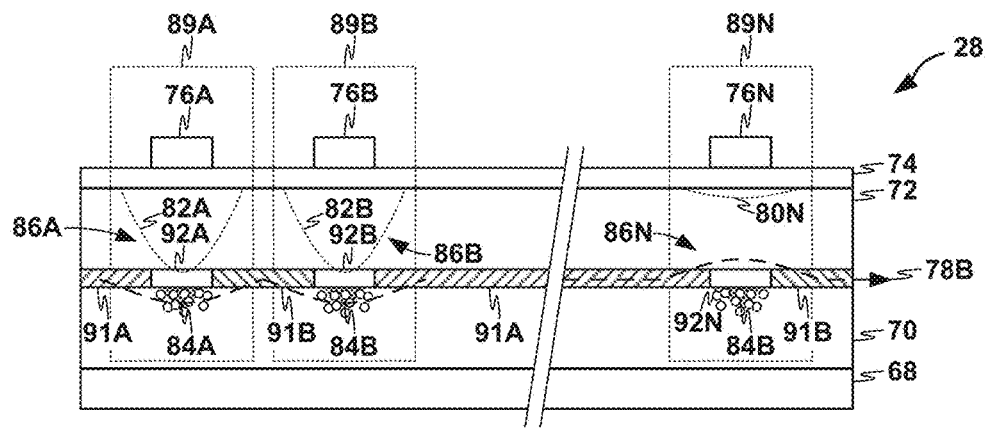

FIGS. 7A and 7B are conceptual diagrams illustrating example details of a memory device that includes a plurality of variable resistance memory cells that are capable of cell transparency, in accordance with one or more techniques of this disclosure. In some examples, memory device 28 may include layers similar to memory device 26 of FIGS. 6A and 6B. For instance, as illustrated in FIGS. 7A and 7B, memory device 28 may include semiconductor substrate layer 68, variable resistance layer 70, channel layer 72, and gates 76A-76N (collectively, "gates 76"). As also illustrated in FIGS. 7A and 7B, memory device 28 may include oxide layer 74 disposed between channel layer 72 and gates 76. Similar to the layers of memory device 26, the layers of memory device 28 may, in some examples, be planar.

In some examples, memory device 28 may include non-conductive plugs 92A-92N (collectively, "plugs 92") positioned within conductive layer 90. As illustrated in FIGS. 7A and 7B, plugs 92 may be respectively aligned with gates 76.

In some examples, memory device 28 may include conductive layer 90 disposed between channel layer 72 and variable resistance layer 70. Similar to conductive layer 90 of FIGS. 6A and 6B which is formed of a plurality of different materials. As illustrated in FIGS. 7A and 7B, conductive layer 90 may include first conductive material 91A and second conductive material 91B alternately disposed between plugs 92. When variable resistance layer 70 includes RRAM, one of the conductive materials may be the source of the metal atoms or oxygen vacancies that modulate the cell conductivity. In one example, first conductive material 91A may be copper and second conductive material 91B may be silver. In such an embodiment, read can be performed driving current in either direction through the string of cells. A write operation however may use higher voltages (higher fields) to move atoms or vacancies in a filamentary conduction path in the ReRAM cell. Applying voltage of one polarity (field in one direction) in a cell may create the filament, and applying voltage in the opposite polarity (field in the opposite direction) in same cell may destroy the filament. In this case, in the first case, the cell may be put in its low resistance state and in the second case that cell may be put in its high resistance state. The skilled in the art will recognize that in order for the filament to be initially formed the choice of materials in the channel needs to have lower electrical permittivity than the material making the solid electrolyte. This makes the programming fields to appear mostly in the solid electrolyte region.

Memory device 28 may include variable resistance memory cells 89A-89N (collectively, "variable resistance memory cells 89"). In some examples, each of variable resistance memory cells 89 may be configured to perform operations similar to variable resistance memory cell 88 of FIGS. 6A and 6B. For instance, each of variable resistance memory cells 89 may be configured to operate in a transparent state in which a respective gate of gates 76 directs current through a respective region of regions 84 and a non-transparent state in which the respective gate of gates 76 does not direct current through the respective region of regions 84.

In operation, memory device 28 may perform similar to memory device 22 of FIGS. 3A and 3B. For instance, to access a particular memory cell of variable resistance memory cells 89, the gate of the particular memory cell may cause at least a portion of current flowing through a region of channel layer 72 below the gate of the particular memory cell to flow through a region of variable resistance layer 70 below the gate of the particular memory cell. As shown in the example of FIG. 7A, where the depletion regions created by gates 76 within channel layer 72 are relatively small (i.e., depletion regions 80), the current may flow along current path 78A which passes through regions 86. Similarly, as shown in the example of FIG. 7B, where the depletion region created by gates 76A and 76B within channel layer 72 are relatively large (i.e., depletion regions 82A and 82B), the current may flow along current path 78B which passes through regions 84A and 84B. However, in examples where conductive layer 90 includes alternating materials, programming two adjacent memory cells may cause the cells to store opposite data. For instance, in the example of FIG. 7B, if variable resistance memory cell 89A is programmed to a high-resistive state, variable resistance memory cell 89B will be programmed to a low-resistive state and vice versa. Where memory device 28 is used in a two-dimensional array (e.g., FIG. 4), for a given current direction, the cells in odd word lines will be programmed to state opposed to those of cells in even wordlines.

Figure 8:
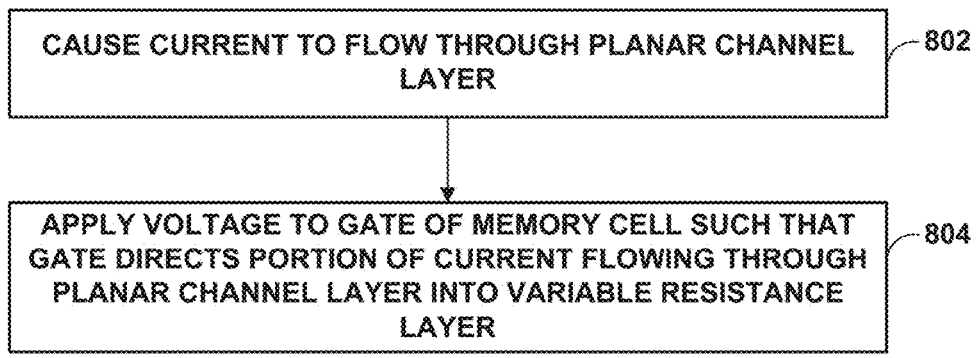
FIG. 8 is a flow diagram illustrating an example technique for accessing a memory cell of a plurality of memory cells capable of cell transparency, in accordance with one or more techniques of this disclosure.

FIG. 8 is a flow diagram illustrating an example technique for accessing a memory cell of a plurality of memory cells capable of cell transparency, in accordance with one or more techniques of this disclosure. The techniques of FIG. 8 will be described with concurrent reference to memory device 20 of FIGS. 2A and 2B for ease of description, although memory devices having configurations different than that of memory device 20 may perform the techniques of FIG. 4.

In accordance with one or more techniques of this disclosure, memory device 20 may cause current to flow through channel layer 72 (802). For instance, as illustrated in the example of FIG. 2A, memory device 20 may cause current to flow along current path 78A which passes through region 86 of channel layer 72.

Memory device 20 may apply a voltage to gate 76 of memory cell 60 such that gate 76 directs at least a portion of the current flowing through channel layer 72 into variable resistance layer 70 (804). For instance, as illustrated in the example of FIG. 2B, memory device 20 may apply a voltage to gate 76 such that gate 76 creates depletion region 82 within variable resistance layer 70. The creation of depletion region 82 may cause the current to flow along current path 78B, which passes through region 84 of variable resistance layer 70. In this way, memory device 20 may access a particular memory cell of one or more memory cells capable of cell transparency.

It should be noted that, while the voltages may be applied to the gates of the memory cells, the channel may not be inverted (i.e., as in a turning on of a CMOS transistor). Instead, the gate voltage may be applied in the opposite direction in the interest of modulating the depletion region extension.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various examples have been described. These and other examples are within the scope of the following claims.

The invention claimed is:

1. A method comprising:
accessing a particular memory cell of one or more memory cells of a memory device that includes a planar semiconductor substrate layer, a planar variable resistance layer disposed above the planar semiconductor substrate layer, a planar channel layer disposed above the planar variable resistance layer, and one or more gates positioned along a length of the memory device and above the planar channel layer, wherein each memory cell of the one or more memory cells is defined by a respective gate of the one or more gates, a respective region of the planar channel layer positioned below the respective gate, and a respective region of the variable resistance layer positioned below the respective gate, wherein accessing the particular memory cell comprises:
  causing a current to flow through the planar channel layer; and
  applying a voltage to the respective gate of the particular memory cell that is greater than a threshold voltage such that the respective gate directs at least a portion of the current flowing through a respective region of the planar channel layer positioned below the respective gate into the respective region of the variable resistance layer positioned below the respective gate.

2. The method of claim 1, wherein accessing the particular memory cell comprises writing data to the particular memory cell by at least:
  modifying a resistive state of the respective region of the variable resistance layer positioned below the respective gate.

3. The method of claim 2, wherein accessing the particular memory cell comprises reading data from the particular memory cell by at least:
  measuring a resistive state of the respective region of the variable resistance layer positioned below the respective gate.

4. The method of claim 3, further comprising contemporaneously accessing a plurality of the one or more memory cells by at least:
  applying voltage to respective gates of the plurality of memory cells that is greater than the threshold voltage such that the respective gates direct at least a portion of the current flowing through respective regions of the planar channel layer positioned below the respective gates into the respective regions of the variable resistance layer positioned below the respective gates.

5. The method of claim 2, further comprising contemporaneously accessing a plurality of the one or more memory cells by at least:
  applying voltage to respective gates of the plurality of memory cells that is greater than the threshold voltage such that the respective gates direct at least a portion of the current flowing through respective regions of the planar channel layer positioned below the respective gates into the respective regions of the variable resistance layer positioned below the respective gates.

6. The method of claim 1, wherein accessing the particular memory cell comprises reading data from the particular memory cell by at least:
  measuring a resistive state of the respective region of the variable resistance layer positioned below the respective gate.

7. The method of claim 6, further comprising contemporaneously accessing a plurality of the one or more memory cells by at least:
  applying voltage to respective gates of the plurality of memory cells that is greater than the threshold voltage such that the respective gates direct at least a portion of the current flowing through respective regions of the planar channel layer positioned below the respective gates into the respective regions of the variable resistance layer positioned below the respective gates.

8. The method of claim 1, further comprising contemporaneously accessing a plurality of the one or more memory cells by at least:
  applying voltage to respective gates of the plurality of memory cells that is greater than the threshold voltage such that the respective gates direct at least a portion of the current flowing through respective regions of the planar channel layer positioned below the respective gates into the respective regions of the variable resistance layer positioned below the respective gates.

\* \* \* \* \*